(12) United States Patent
Wu et al.

(10) Patent No.: US 8,704,384 B2
(45) Date of Patent: Apr. 22, 2014

(54) STACKED DIE ASSEMBLY

(75) Inventors: Ephrem C. Wu, San Mateo, CA (US); Raghunandan Chaware, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 16 days.

(21) Appl. No.: 13/399,939

(22) Filed: Feb. 17, 2012

(65) Prior Publication Data

US 2013/0214432 A1 Aug. 22, 2013

(51) Int. Cl.
*H01L 23/48* (2006.01)
*H01L 21/56* (2006.01)

(52) U.S. Cl.
USPC ............ 257/782; 257/E23.085; 257/E21.529; 257/E23.01; 257/E21.504; 257/686; 257/685; 257/777; 257/723; 257/724; 257/728; 257/48; 257/620; 257/678; 257/725; 716/110

(58) Field of Classification Search
USPC .......... 257/782, E21.529, 686, 685, 777, 723, 257/724, 728, 48, 620, 678, 725, E23.085; 716/110
See application file for complete search history.

(56) References Cited

U.S. PATENT DOCUMENTS

| | | | |
|---|---|---|---|
| 4,467,342 A | 8/1984 | Tower | |
| 4,803,595 A | 2/1989 | Kraus et al. | |
| 5,399,898 A | 3/1995 | Rostoker | |
| 5,489,804 A | 2/1996 | Pasch | |
| 5,715,144 A | 2/1998 | Ameen et al. | |
| 5,814,847 A | 9/1998 | Shihadeh et al. | |
| 5,869,894 A | 2/1999 | Degani et al. | |
| 5,907,903 A | 6/1999 | Ameen et al. | |
| 6,239,366 B1 | 5/2001 | Hsuan et al. | |
| 6,369,444 B1 | 4/2002 | Degani et al. | |
| 6,407,456 B1 | 6/2002 | Ball | |
| 6,410,983 B1 | 6/2002 | Moriizumi et al. | |
| 6,429,509 B1 | 8/2002 | Hsuan | |
| 6,500,696 B2 | 12/2002 | Sutherland | |
| 6,559,531 B1 | 5/2003 | Sutherland | |
| 6,611,635 B1 * | 8/2003 | Yoshimura et al. | 385/14 |
| 6,731,009 B1 | 5/2004 | Jones et al. | |
| 6,734,553 B2 | 5/2004 | Kimura | |
| 6,870,271 B2 | 3/2005 | Sutherland et al. | |

(Continued)

OTHER PUBLICATIONS

U.S. Appl. No. 13/369,215, filed Feb. 8, 2012, Banijamali, Bahareh, Xilinx, Inc., 2100 Logic Drive, San Jose, CA US.

(Continued)

*Primary Examiner* — Alexander Oscar Williams
(74) *Attorney, Agent, or Firm* — W. Eric Webostad; John J. King

(57) ABSTRACT

A stacked die assembly for an IC includes a first interposer; a second interposer; a first integrated circuit die, a second integrated circuit die, and a plurality of components. The first integrated circuit die is interconnected to the first interposer and the second interposer, and the second integrated circuit die is interconnected to the second interposer. The plurality of components interconnect the first integrated circuit die to the first interposer and the second interposer. The plurality of components that interconnect the first integrated circuit die to the first interposer and the second interposer are located outside an interconnect restricted area of the first interposer and the second interposer, and signals are routed between the first integrated circuit die and the second integrated circuit die via the first integrated circuit die avoiding the interconnect restricted area of the first interposer and the second interposer.

20 Claims, 14 Drawing Sheets

(56) References Cited

U.S. PATENT DOCUMENTS

| | | | |
|---|---|---|---|
| 6,930,378 B1 | 8/2005 | St. Amand et al. | |
| 6,972,487 B2 | 12/2005 | Kato et al. | |
| 6,984,889 B2 | 1/2006 | Kimura | |
| 6,992,395 B2 | 1/2006 | Fukasawa | |
| 7,030,466 B1 | 4/2006 | Hsuan | |
| 7,071,568 B1 | 7/2006 | St. Amand et al. | |
| 7,087,989 B2 | 8/2006 | Nakayama | |
| 7,098,542 B1 | 8/2006 | Hoang et al. | |
| 7,132,753 B1 | 11/2006 | St. Amand et al. | |
| 7,215,016 B2 | 5/2007 | Wang | |
| 7,230,329 B2 | 6/2007 | Sawamoto et al. | |
| 7,402,901 B2 | 7/2008 | Hatano et al. | |
| 7,425,760 B1 | 9/2008 | Guenin et al. | |
| 7,436,061 B2 | 10/2008 | Nakayama | |
| 7,459,776 B1 | 12/2008 | St. Amand et al. | |
| 7,859,119 B1 | 12/2010 | St. Amand et al. | |
| 7,906,852 B2 | 3/2011 | Nishimura et al. | |
| 7,999,383 B2 | 8/2011 | Hollis | |
| 8,062,968 B1 | 11/2011 | Conn | |
| 8,072,057 B2 | 12/2011 | Matsumura | |
| 8,080,874 B1 | 12/2011 | Werner et al. | |
| 8,097,957 B2 | 1/2012 | Chen et al. | |
| 8,163,600 B2 | 4/2012 | Chow et al. | |
| 8,227,904 B2 | 7/2012 | Braunisch et al. | |
| 8,237,289 B2 | 8/2012 | Urakawa | |
| 8,274,794 B2 | 9/2012 | Huang et al. | |
| 8,295,056 B2 * | 10/2012 | Andry et al. | 361/760 |
| 8,338,963 B2 | 12/2012 | Haba et al. | |
| 8,344,519 B2 | 1/2013 | Lu et al. | |
| 8,415,783 B1 * | 4/2013 | Rahman et al. | 257/686 |
| 2002/0024146 A1 | 2/2002 | Furusawa | |
| 2002/0175421 A1 | 11/2002 | Kimura | |
| 2003/0183917 A1 | 10/2003 | Tsai et al. | |
| 2004/0184250 A1 | 9/2004 | Wang | |
| 2004/0195668 A1 | 10/2004 | Sawamoto | |
| 2004/0195682 A1 | 10/2004 | Kimura | |
| 2004/0227223 A1 | 11/2004 | Sawamoto | |
| 2006/0001163 A1 | 1/2006 | Kolbehdari et al. | |
| 2006/0017147 A1 | 1/2006 | Drost et al. | |
| 2006/0099736 A1 | 5/2006 | Nagar et al. | |
| 2006/0157866 A1 | 7/2006 | Le et al. | |
| 2006/0220227 A1 | 10/2006 | Marro | |
| 2006/0226527 A1 | 10/2006 | Hatano et al. | |
| 2006/0226529 A1 | 10/2006 | Kato et al. | |
| 2007/0023921 A1 | 2/2007 | Zingher et al. | |
| 2007/0029646 A1 | 2/2007 | Voldman | |
| 2007/0210428 A1 | 9/2007 | Tan et al. | |
| 2007/0231966 A1 * | 10/2007 | Egawa | 438/114 |
| 2007/0278642 A1 | 12/2007 | Yamaguchi et al. | |
| 2008/0179735 A1 | 7/2008 | Urakawa | |
| 2009/0057919 A1 | 3/2009 | Lin et al. | |
| 2009/0267238 A1 | 10/2009 | Joseph et al. | |
| 2010/0330741 A1 | 12/2010 | Huang et al. | |
| 2011/0019368 A1 * | 1/2011 | Andry et al. | 361/748 |
| 2011/0169171 A1 | 7/2011 | Marcoux | |
| 2011/0180317 A1 | 7/2011 | Takahashi et al. | |
| 2011/0254162 A1 | 10/2011 | Hollis | |
| 2011/0316572 A1 | 12/2011 | Rahman | |
| 2012/0019292 A1 | 1/2012 | Lu et al. | |
| 2012/0020027 A1 * | 1/2012 | Dungan et al. | 361/718 |
| 2012/0032342 A1 | 2/2012 | Min et al. | |
| 2012/0124257 A1 * | 5/2012 | Wu | 710/106 |
| 2012/0206889 A1 * | 8/2012 | Norman | 361/761 |
| 2012/0301977 A1 * | 11/2012 | Andry et al. | 438/14 |
| 2012/0319248 A1 | 12/2012 | Rahman | |
| 2013/0020675 A1 | 1/2013 | Kireev et al. | |
| 2013/0134553 A1 * | 5/2013 | Kuo et al. | 257/532 |

OTHER PUBLICATIONS

U.S. Appl. No. 13/527,453, filed Jun. 19, 2012, Hisamura, Toshiyuki, Xilinx, Inc., 2100 Logic Drive, San Jose, CA US.

U.S. Appl. No. 13/535,102, filed Jun. 27, 2012, Camarota, Rafael C., Xilinx, Inc., 2100 Logic Drive, San Jose, CA US.

* cited by examiner

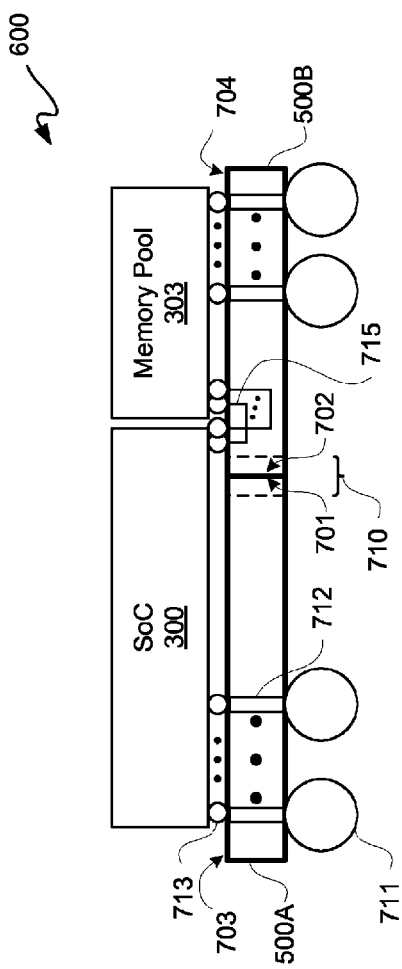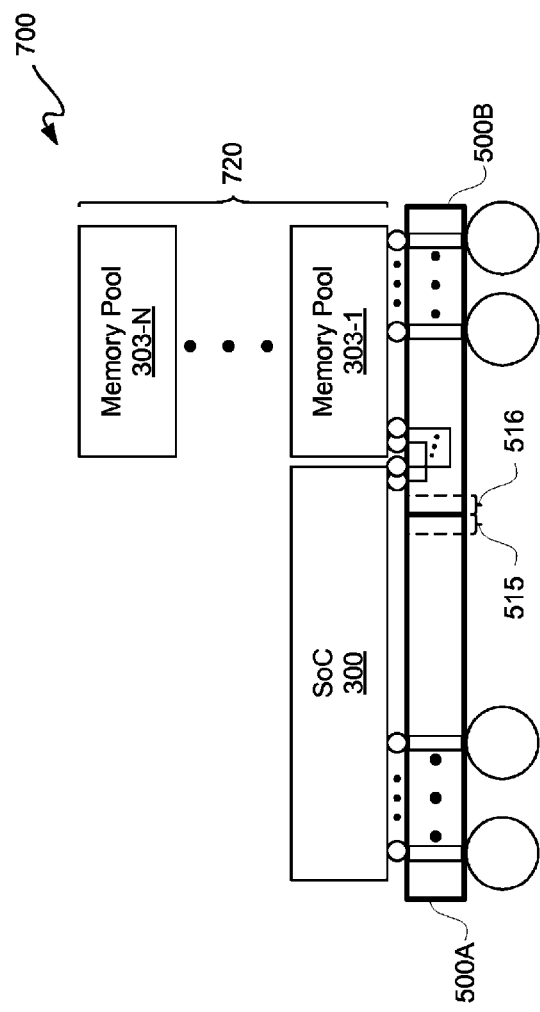

STACKED DIE ASSEMBLY

FIELD OF THE INVENTION

An embodiment relates to integrated circuit devices ("ICs"). More particularly, an embodiment relates to a stacked die assembly for an IC.

BACKGROUND

Integrated circuits have become more "dense" over time, i.e., more logic features have been implemented in an IC. More recently, Stacked-Silicon Interconnect Technology ("SSIT") allows for more than one semiconductor die to be placed in a single package. SSIT ICs may be used to address increased demand for communication bandwidth. However, even though ICs using SSIT have more than one die, such ICs still have significant bandwidth restriction due to pin constraints.

Hence, it is desirable to provide an SSIT IC having less bandwidth restriction.

SUMMARY

One or more embodiments generally relate to a stacked die assembly for an IC.

An embodiment relates generally to an assembly. In such an embodiment, included are a first interposer; a second interposer; a first integrated circuit die, a second integrated circuit die, and a plurality of components. The first integrated circuit die is interconnected to the first interposer and the second interposer, and the second integrated circuit die is interconnected to the second interposer. The plurality of components interconnect the first integrated circuit die to the first interposer and the second interposer. The plurality of components that interconnect the first integrated circuit die to the first interposer and the second interposer are located outside an interconnect restricted area of the first interposer and the second interposer. Signals are routed between the first interposer and the second interposer via the first integrated circuit die and the plurality of components, avoiding the interconnect restricted area of the first interposer and the second interposer.

Another embodiment relates generally to another assembly. In such an embodiment, a first integrated circuit die is interconnected to a first interposer; a second integrated circuit die is interconnected to a second interposer; and a third integrated circuit die is interconnected to both the first interposer and the second interposer. The third integrated circuit die provides a communication bridge between the first integrated circuit die and the second integrated circuit die, where the third integrated circuit die includes an array of bidirectional repeaters or a set of crossbar switches each of which is capable of being statically configured for communication between the first integrated circuit die and the second integrated circuit die.

An embodiment relates generally to a method for forming an assembly. In such an embodiment, a first integrated circuit die is interconnected to a first interposer and a second interposer using a plurality of components, and a second integrated circuit die is interconnected to the second interposer using the plurality of components. A portion of each of the first interposer and the second interposer is reserved to provide an interconnect restricted region. The plurality of components that interconnect the first integrated circuit die to the first interposer and the second interposer are located outside of the interconnect restricted region, and signals are routed between the first integrated circuit die and the second integrated circuit die via the first integrated circuit die avoiding the interconnect restricted area of the first interposer and the second interposer.

BRIEF DESCRIPTION OF THE DRAWINGS

Accompanying drawings show exemplary embodiments. However, the accompanying drawings should not be taken to limit the embodiments shown, but are for explanation and understanding only.

FIG. 7A is a block diagram depicting an exemplary embodiment of a cross-sectional view of any of the stacked die assemblies of FIG. 6A, 6B, or 6C.

FIG. 7B is a block diagram depicting a cross-sectional view of another exemplary embodiment of a stacked die assembly.

DETAILED DESCRIPTION

Figure 1:
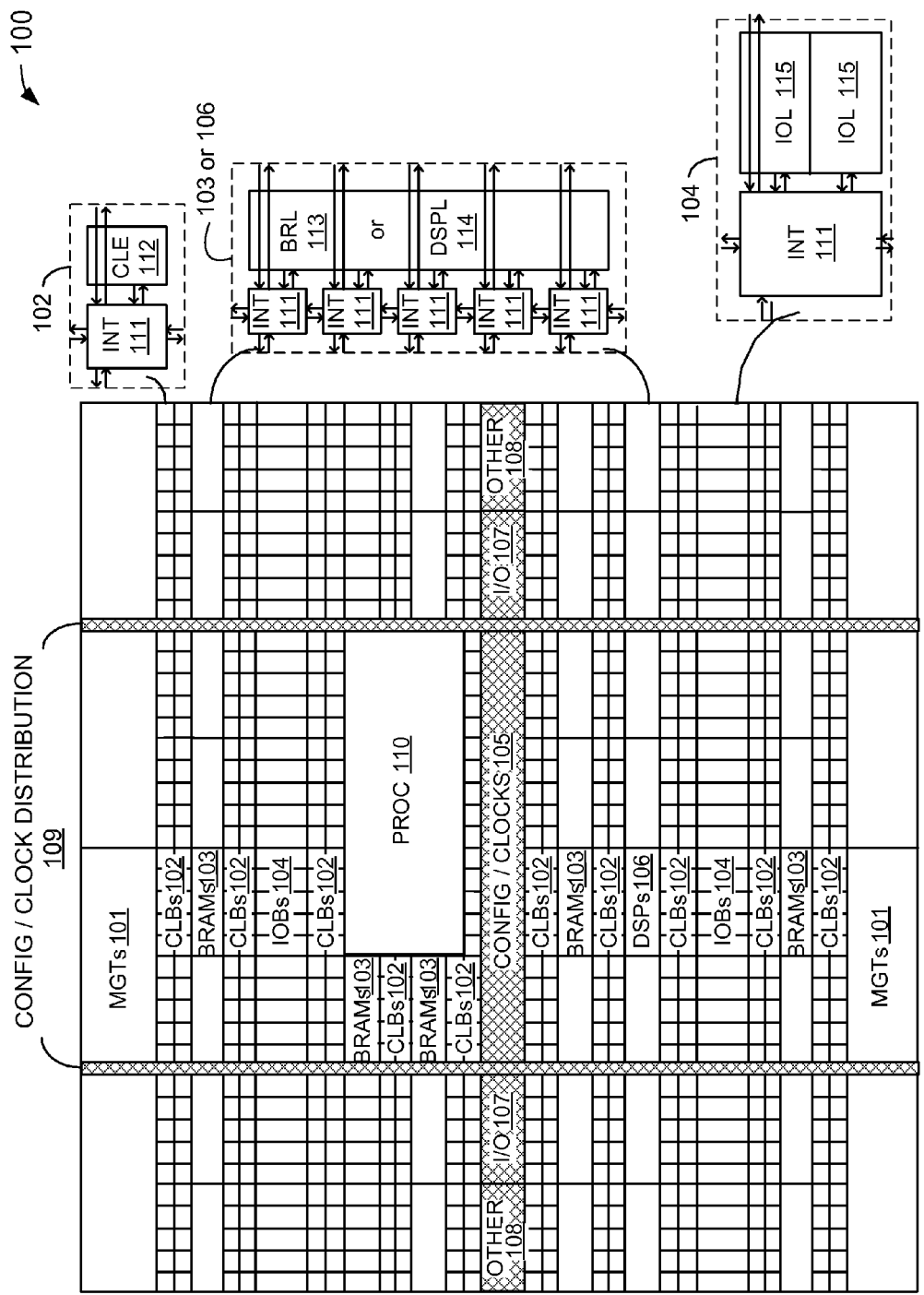
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

Heretofore a memory pool with DDR3 or DDR4 DRAM, or memory with serial links, was pin limited which limited bandwidth of an IC. For example, currently line-side bandwidth is approximately 200 gigabits per second ("Gbps"); however, next generation devices may have line-side bandwidth of approximately 400 Gbps. To support 400 Gbps, DDR memory may have a bandwidth on the order of approximately 1.2 terabits per second ("Tbps"). Unfortunately, there are not enough DDR memory pins on an FPGA to support 1.2 Tbps using conventional approaches. By way of example and not limitation, serial memory, such as DRAM with serial I/Os, may use 64 transceivers which involves 256 signal pins in addition to power, ground, and other reference pins to support 200 Gbps. Another limitation on bandwidth had to do with the amount of pins available for line-side and system-side serializers-deserializers ("SERDES"). As a side, system-side bandwidth is significantly larger than line-side bandwidth, and thus a system-side interface would benefit more from additional pins.

With Stacked-Silicon Interconnect Technology ("SSIT"), more than one active die may be coupled to an interposer or carrier die, whether such interposer is an active interposer or a passive interposer. For purposes of clarity and not limitation, it shall be assumed that a passive interposer is used, even though in other embodiments an active interposer may be used. Yet, heretofore, even with SSIT, interposer area was too small to provide a sufficient pin count for obtaining for example enough bandwidth for a 400 Gbps application.

However, by employing SSIT with an interposer assembly as described herein, more pin sites are available even with lithographic printing size limitations. Thus, even with large semiconductor die, it is feasible to include for example more than one gigabyte of DDR DRAM with at least one other die inside a single IC package.

With the above general understanding borne in mind, various embodiments for stacked die assemblies are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
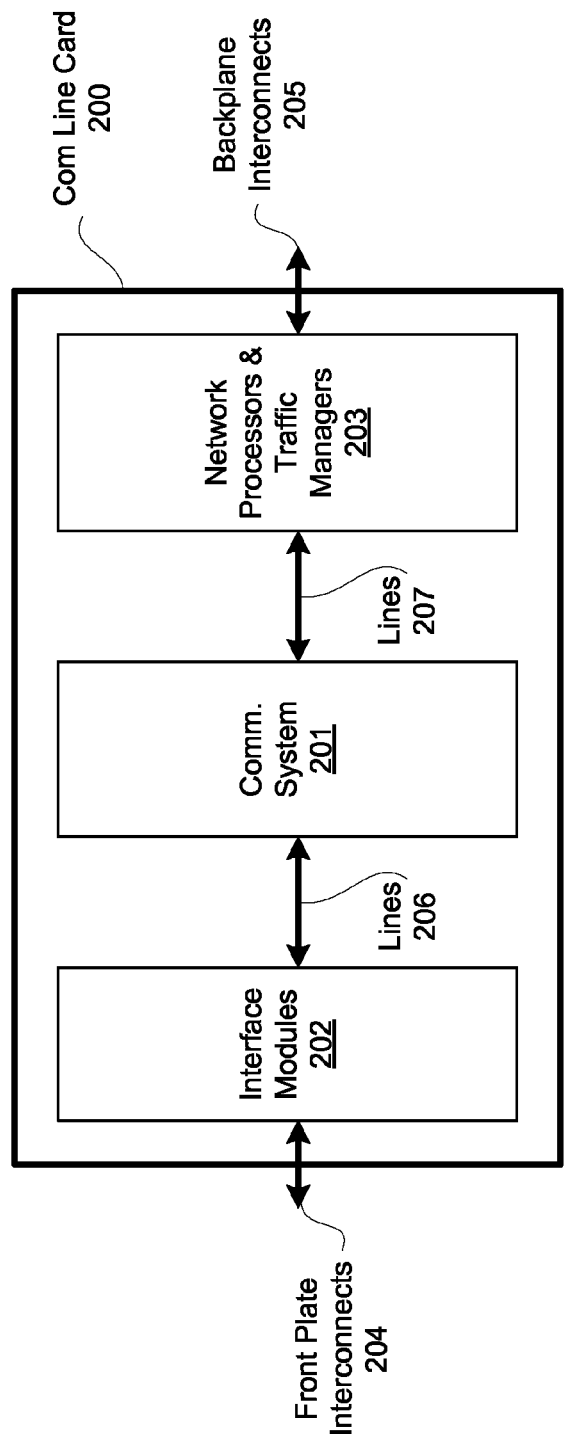
FIG. 2 is a block diagram depicting an exemplary embodiment of a communications line card.

FIG. 2 is a block diagram depicting an exemplary embodiment of a communications line card 200. Communications line card 200 may include one or more interface modules 202, a communications system 201, and network processors and traffic managers 203. Interface modules 202 may provide interconnects for front plate interconnects 204. Front plate interconnects 204 may be used for bidirectional communication with interface modules 202. One or more of interface modules 202 may include optical interconnects.

Interface modules 202 may be coupled to communications system 201 via lines 206. Communications system 201 may be coupled to network processors and traffic managers 203 via lines 207. Network processors and traffic managers 203 may be coupled to backplane interconnects 205. It should be understood that lines 206, lines 207, and backplane interconnects 205 may be used for bidirectional communication.

Figure 3:
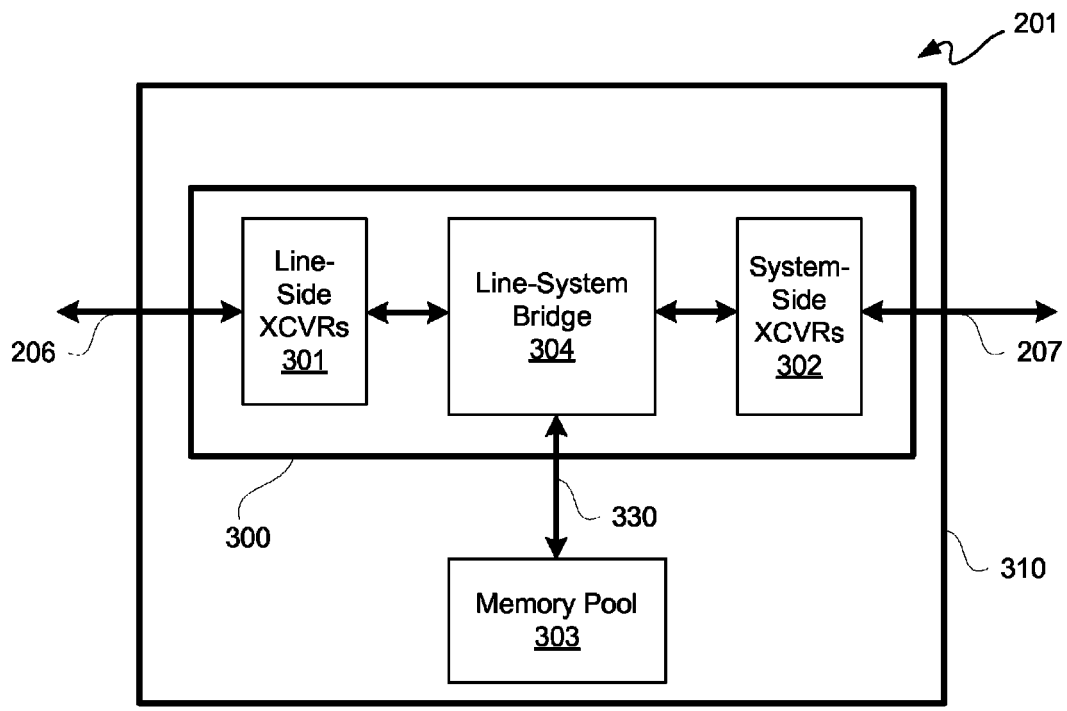
FIG. 3 is a block diagram depicting an exemplary embodiment of a communications system.

FIG. 3 is a block diagram depicting an exemplary embodiment of a communications system 201. Communication system 201 may include IC dies, such as for example a System-on-a-Chip die ("SoC") 300 and one or more memory dies ("memory pool") 303. However, in other embodiments, one or more of these and/or other types of IC die may be used. In an embodiment, SoC 300 may be implemented as an FPGA, such as previously described herein for example. However, it should be understood that other types of ICs, such as ASICs, ASSP, and the like for example, may be used for providing SoC 300. In this embodiment, SoC 300 includes line-side transceivers 301, line-system bridge 304, and system-side transceivers 302. Lines 206 may be interconnected to line-side transceivers 301, and lines 207 may be interconnected to system-side transceivers 302. Line-system bridge 304 may be interconnected to both system-side transceivers 302 and line-side transceivers 301 for bidirectional communication.

Memory pool 303 may be interconnected to line-system bridge 304 via interconnects 330 for bidirectional communication. By providing greater interconnect density as associated with interconnects 330 by use of an interposer as described herein, bandwidth of approximately 1.0 terabits per second ("Tbps") or more may be provided. For purposes of clarity by way of example and not limitation, with enough double-data-rate ("DDR") pins, bandwidth for packet buffering for a 400 or faster gigabit line card may be provided while fitting within maximum reticle dimensions using multiple interposed dies ("interposers"). In an embodiment, multiple interposers are printed on a same wafer without severing at least pairs of adjacent interposers, namely an extended interposer embodiment. In another embodiment, interposers are completely separated from one another and subsequently coupled to one another using a bridging die. In an embodiment, conventional FPGA slices may be used for an extended interposer embodiment.

By fine pitch interconnects, it is generally meant interconnects with a pitch associated with lower-level metal layers. In some embodiments, some fine pitch interconnects may be 0.8 microns or less, where pitch takes into account wire width for wire spacing. In other embodiments, some fine pitch interconnects may be 0.4 microns or less. It has been suggested that fine pitch interconnects can be formed with a dense metal pitch of approximately 90 nm, or 0.09 microns, in a 28 nm process. Accordingly, it should be understood that in some embodiments, fine pitch interconnects may have a pitch which is less than 100 nm. In some embodiments, fine pitch interconnects may be less than that supported by lithography limitations at the edge of an imaging field, namely a reduction in image quality at field edges of an image field. Examples of fine pitch interconnects include without limitation dense flip-chip micro bumps or balls with associated dense flip-chip micro bump pads. Such fine pitch interconnects may be in a staggered array, such that horizontal and vertical minimum pitches are different from one another. Accordingly, fine pitch interconnects are substantially denser than conventional flip-chip micro bumps.

An interposer assembly 310, as described herein, may be housed in a single IC package with two or more dies stacked thereon or therewith. In an embodiment, interposer assembly 310 may be an extended interposer having two or more interposers formed on a same wafer using same or different mask sets, where such two or more interposers are not severed from one another, namely are left joined together at what might otherwise be a scribe line area on such wafer. In another embodiment, interposer assembly 310 may be two severed dies coupled to one another by a bridging die, as described below in additional detail.

For purposes of clarity by way of example not limitation, it shall be assumed that memory pool 303 is formed with a form of double data rate ("DDR") random access memory ("RAM"), including without limitation DDR DRAM; however, it should be understood that other types of memory including other types of memory interfaces, such as QDR for example, may be used.

Generally, for communication links at 400 gigabits per second ("Gbps") and beyond, packet buffering peak bandwidth exceeds one Tbps. SSIT is capable of supporting more than one Tbps between SoC 300 and memory pool 303 using DDR-based DRAM provided a sufficient number of interconnects 330 exist between such SoC 300 and memory pool 303, which pin density is now available due to an increase of the maximum size of available interposer area, as described below.

Figure 4:
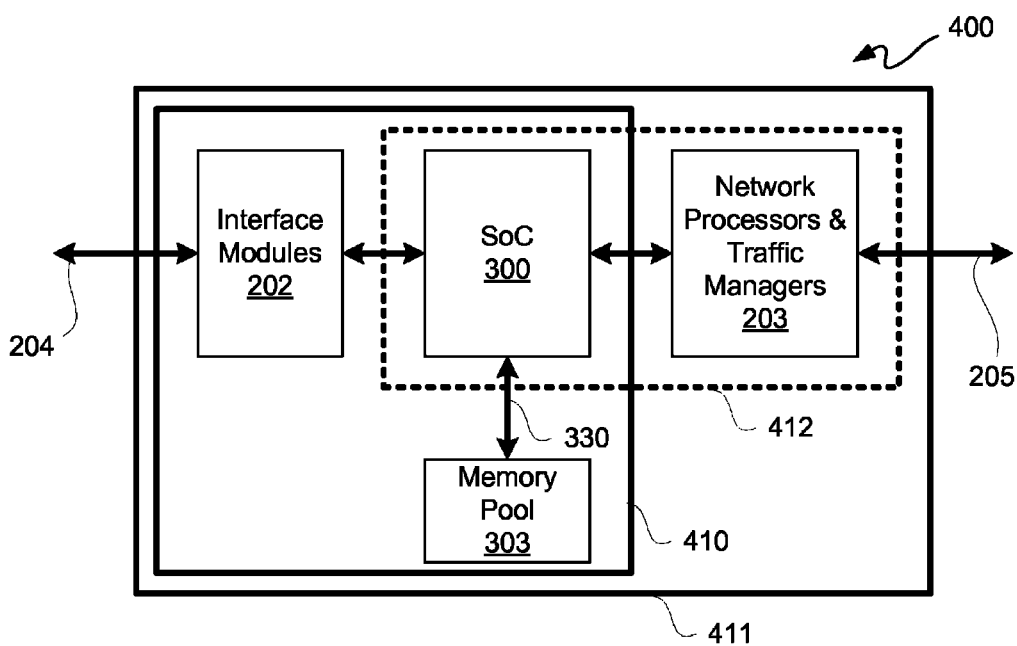
FIG. 4 is a block diagram depicting another exemplary embodiment of a communications system.

FIG. 4 is a block diagram depicting another exemplary embodiment of a communications system 400. Communication system 400 may include communications system 201 of FIG. 3, interface modules 202, and network processors and traffic managers 203. In an embodiment, interface modules 202, SoC 300, and memory pool 303 may be interconnected to a same interposer assembly 410. Interposer assembly 410, like interposer assembly 310 of FIG. 3, may be an extended interposer embodiment in communication system 400 having two or more interposers formed on a same wafer using same or different mask sets, where such two or more interposers are not severed from one another, namely are left joined together at what might otherwise be a scribe line area on such wafer. In another embodiment, interposer assembly 410 may be separate interposers coupled to one another by a bridging die.

In an embodiment, interface modules 202, SoC 300, memory pool 303, and network processors and traffic managers 203 are interconnected to a same interposer assembly 411, where interposer assembly 411 includes interposer assembly 410. In other words, interposer assembly 411 may include more interposers joined together than interposer assembly 410, and thus effectively interposer assembly 411 would replace or include interposer assembly 410. For SoC 300 implemented with one or more FPGAs, one or more network processor and/or one or more traffic manager of network processors and traffic managers 203 may be instantiated in such one or more FPGAs, as generally indicated with dotted line 412.

Accordingly, using an interposer assembly as described herein, an embodiment of communications system 400 may be entirely contained within a single packaged IC having interposer assembly 411. In another embodiment of communications system 400, a single packaged IC having interposer assembly 410 may be coupled via a printed circuit board ("PCB") to network processors and traffic managers 203. By bridging interposers, whether such interposers are separate dies or of an extended interposer embodiment, with an IC die, such as an SoC or other type of IC die, die-to-die interconnects, such as fine pitch interconnects for example, may be used in comparison to much larger conventional die-to-die interconnects and/or chip-to-chip interconnects, such as conventional micro bumps or micro balls, respectively, for example. Accordingly, interconnect density may be significantly enhanced by using an interposer assembly with fine pitch interconnects for die-to-die interconnecting.

Figure 5:
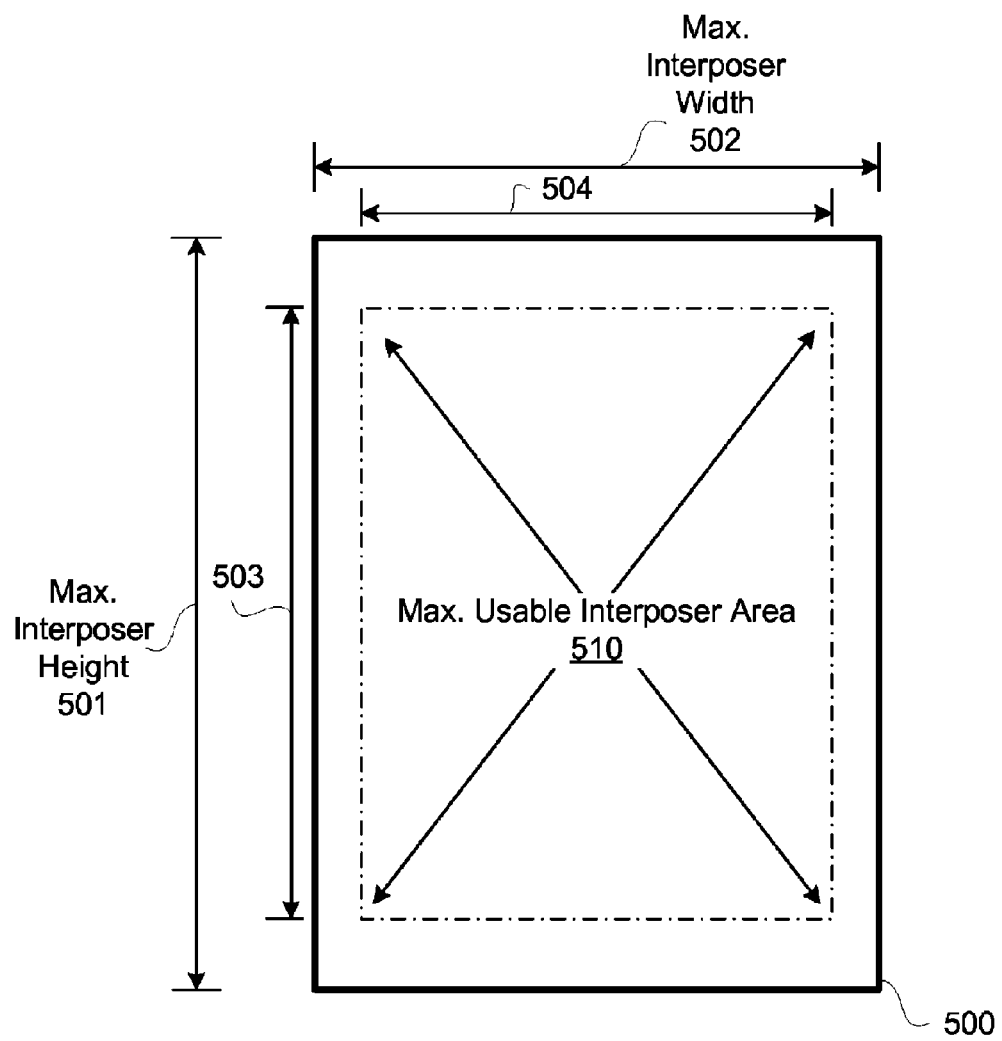
FIG. 5 is a block diagram depicting an exemplary embodiment of a single interposer die.

FIG. 5 is a block diagram depicting an exemplary embodiment of a single interposer 500. Interposer 500 has a maximum interposer height 501 and a maximum interposer width 502. These maximum height 501 and width 502 are generally determined by lithography, and in particular may be limited by reticle imaging size. Additionally restricting maximum usable interposer area 510 are offsets 511 through 514 from edges of interposer 500. These offsets may be due to providing margins for packaging and assembly, such as a package lid, scribe lines, a seal ring, and under fill margining, as well as lithographic imaging. For purposes of clarity by way of example and not limitation, interposer 500 may be cut out of a silicon wafer by first using laser ablation to create trenches along scribe lines followed by cutting with a diamond tipped circular blade along such laser ablated trenches. Laser ablation may be used to reduce chipping or delamination along such edges in comparison with cutting with a diamond tipped circular blade alone. However, laser ablation tends to leave a wider trench than cutting with a diamond tipped circular blade.

Taking into account such offsets, a maximum usable interposer height 503 and a maximum usable interposer width 504 may define a maximum usable interposer area 510. However, some of this area may be a restricted area. As described below in additional detail, for a left-side interposer of an interposer assembly, a right edge of a portion of area 510, such as offset region 512, for such left-side interposer may align with a left edge of an "interconnect restricted area." By "interconnect restricted area," it is generally meant a region associated with other regions which are not sufficiently reliable or otherwise not available for fine pitch alignment of operative fine pitch interconnects. For example, for a right-side interposer of an interposer assembly, a left edge of such right-side interposer may align with a right edge of such an interconnect restricted area. Even though right and left have been used for side-by-side interposers, a top and bottom orientation may be used.

An interconnect restricted area thus may include parts, such as offsets for example, of a first interposer and a second interposer, where signals are routed via a bridging die to avoid the interconnect restricted area of the first interposer and the second interposer. Because an offset region of an interposer may be at a far edge area of a reticle imaging field, imaging fine pitch interconnects at such far edge area may not be performed reliably. In contrast, fine pitch interconnects may be reliably formed more towards the center of such reticle imaging field, for example such as used in the formation of a die bridging first and second interposers. Thus, while fine pitch interconnects may not be reliably aligned in offset regions of first and second interposers, such fine pitch interconnects may be used to carry signals in a bridging die above such offset regions. Accordingly, generally, fine pitch interconnects are formed outside of an interconnect restricted area of such first and second interposers, such that a plurality of components that interconnect the integrated circuit die to the first interposer and the second interposer are located outside the interconnect restricted area. In contrast, conventional micro bumps for example may be located in an interconnect restricted area. By employing an interconnect restricted area, alignment problems associated therewith, such as for example fine pitch-to-fine pitch alignment, may be avoided by effectively positioning an inter-reticle imaging field seam, including without limitation a seam of overlapping adjacent inter-reticle imaging fields, away from inter-die interposer interconnects. Generally, an inter-reticle imaging field seam is where at least two image fields, whether from same or different reticles, of a lithographic operation overlap with one another. Thus, for example, metal wires for one inter-die interposer interface, such as for example from one group of micro bumps on one active die to another group of micro bumps on another active die, may be formed entirely within one interposer reticle field. More particularly, with respect to fine pitch interconnects, such inter-die interposer interface may be moved away from a far edge area of a reticle image field for an interposer.

An interconnect restricted area, in addition to being associated with areas of offsets, may optionally include a portion of otherwise usable area of interposer area 510, such as from a right-side and/or a left-side interposer for enhanced margin. In an extended interposer embodiment, an IC die, such as an FPGA die bridges interposers which are joined together from a same wafer, for example bridges offset regions 511 and 512 from right and left interposers, respectively, of an interposer assembly, such as interposer assembly 310 or 410 for example. Thus, scribe line areas of such interposers below such FPGA die may form at least part of an interconnect restricted area.

Additionally, in an extended interposer embodiment, because the amount of dicing cuts may be reduced, offsets may likewise be reduced as some edges of an interposer may not be cut or otherwise severed. In other words, because dicing of interposers of interposer assemblies of an extended interposer embodiment is lessened, namely some interposers are not severed from one another, scribe line area between such interposers may be reduced. However, for purposes of clarity and not limitation, it shall be assumed that scribe line areas on a wafer are generally uniform as between all dies thereof, even though in other embodiments scribe line areas on a wafer may not be generally uniform as between all dies thereof. Again, it should be understood that offset areas may be at far edge areas of a lithographic imaging field, and as such it may not be possible to reliably form fine pitch interconnects in such offset areas.

An interconnect restricted area is described at least with respect to being responsive to offset regions of interposers, and in some embodiments may include a gap between interposers and/or otherwise useable area of one or more interposers subject to lithographic imaging field geometric limitations. An interconnect restricted area may be defined as a design rule and/or layout rule for design of an interposer or interposers. In other words, such interconnect restricted area may be thought of as being on a die to which a bridging die is interconnected. Conductive lines as well as other interconnects of such interposers may likewise be associated with an interconnect restriction. Furthermore, a gap between interposers may likewise be associated with an interconnect restricted region.

Generally, for purposes of clarity and not limitation, an interconnect restricted area is referred to herein as defined on interposers responsive at least to portions of offset regions of such interposers. Moreover, for purposes of clarity and not limitation, an interconnect restriction region of an interposer is referred to herein as an offset region. Furthermore, an interconnect restricted area may be of any die, including an active die or a passive die, as an interposer may be an active device or a passive device. However, for purposes of clarity and not limitation, it shall be assumed that interposers are passive devices. Furthermore, a bridging die to connect one interposer to another interposer, whether severed or extended interposers, may be an active die or a passive die. Along those lines, it should be appreciated that fine pitch interconnects to a bridging die may be located on opposing sides of an interconnect restricted area of first and second interposers.

For purposes of clarity by way of example not limitation, maximum interposer height 501 may be approximately 31 mm (approximately 1.22 inches) after package lid footprint margining, and presently maximum interposer width 502 may be approximately 26 mm (approximately 1.024 inches) after package lid footprint margining. With scribe line and seal ring offsets, maximum usable interposer height 503 may be approximately 29 mm (approximately 1.142 inches), and maximum usable interposer width 504 may be approximately 24 mm (approximately 0.9449 inch). Thus, presently a maximum usable interposer area 510 may be approximately 700 mm$^2$ (approximately 27.56 square inches), and this maximum usable interposer area 510 should be considered in view of presently existing monolithic die sizes of approximately 600 mm$^2$ (approximately 23.62 square inches) or above for high-end devices. Heretofore, 1 gigabit of memory would have consumed approximately 25% to 50% of interposer usable area, and thus such an amount of memory could not be packaged with large high-end devices. This meant that pin counts density was significantly limited due to size of such interconnects. However, buffering using one gigabyte of memory may effectively only account for approximately 2.5 ms of 400 Gbps traffic, which may lead to an improper balance with respect to utilization of transceivers and line-system bridging.

As will be appreciated from the following description, more usable interposer area is provided by effectively bridging two or more interposers to provide a stacked die assembly. For an extended interposer embodiment, this may involve using one or more die interconnected to two or more interposers, where such interposer dies are formed on a same wafer as a single platform for providing a single IC package. In this embodiment, the two or more interposers are physically connected to one another as a single platform, in contrast to an embodiment where two or more separated interposers make physical contact with each other. In an embodiment, reticle imaging fields used to form interposers may or may not overlap with one another. In another embodiment, interposers may be completely severed from one another and then coupled using a bridging die. In yet another embodiment, interposer dies may be completely severed from one another and then molded together for a single IC package, as described below for example, and bridged with a bridging die.

Figure 6A:
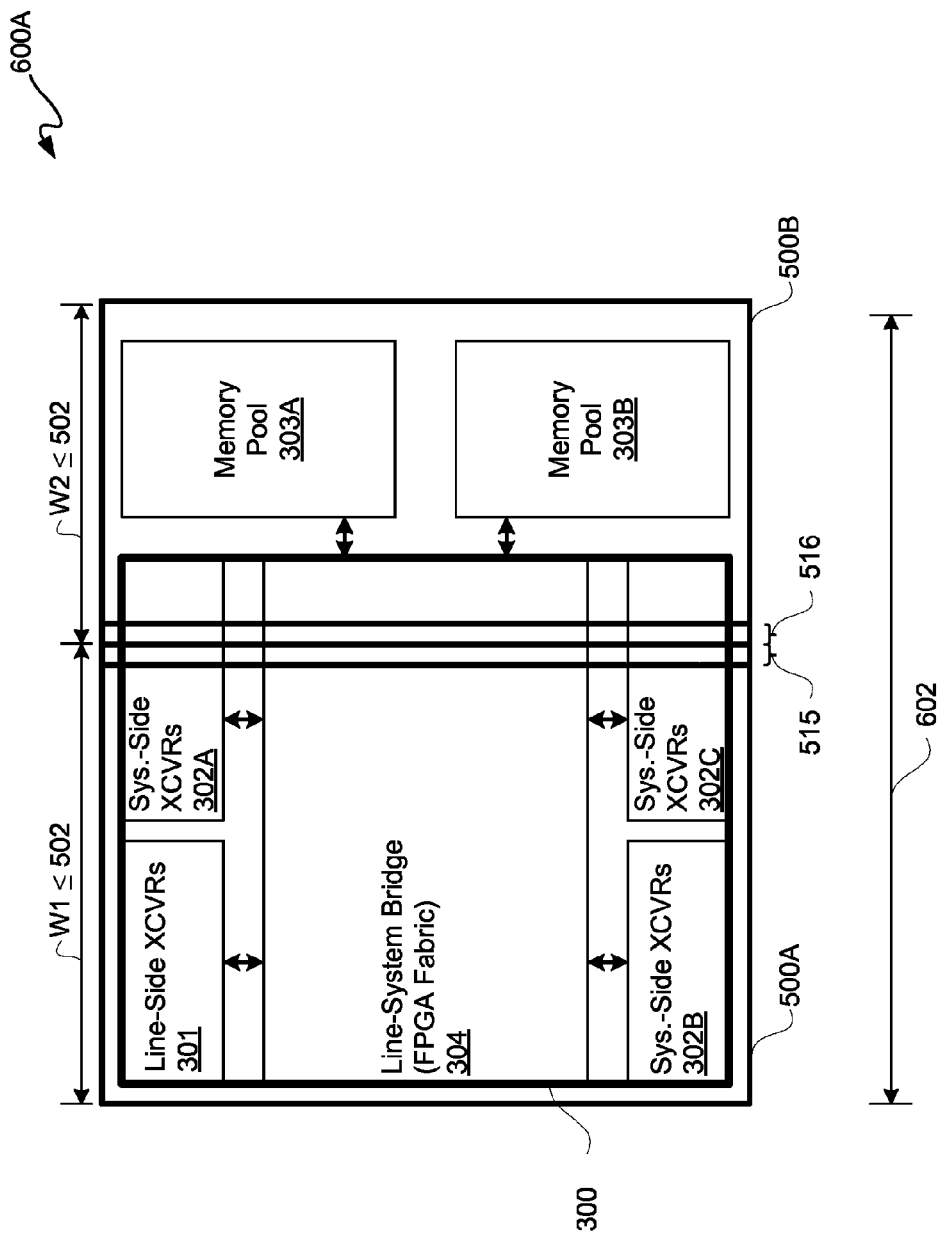
FIG. 6A is a block diagram depicting an exemplary embodiment of a stacked die assembly.

FIG. 6A is a block diagram depicting an exemplary embodiment of an assembly such as, e.g., stacked die assembly 600A. Stacked die assembly 600A includes SoC 300, memory pools 303A and 303B, and an interposer assembly of interposers 500A and 500B whether for an extended interposer embodiment or completely severed interposers 500A and 500B. For purposes of clarity by way of example and not limitation, it shall be assumed that SoC 300 is an FPGA; however, it should be understood that other types of ICs may be used.

In an embodiment, SoC 300 may include line-side transceivers 301, system-side transceivers 302A through 302C, and line-system bridge 304. Line-side transceivers 301 and system-side transceivers 302A through 302C may be coupled for bidirectional communication via line-system bridge 304, and such coupling may be an intra-die coupling, such as by using PIPs of an FPGA. Line-system bridge 304 may be implemented in FPGA programmable resources, namely "FPGA fabric".

SoC 300 may be interconnected to both interposer 500A and 500B, such as to a surface of interposer 500A and to a surface of interposer 500B. For example, SoC 300 may extend from an upper surface of interposer 500A to an upper surface of interposer 500B so as to bridge interposers 500A and 500B. In an extended interposer embodiment, interposers 500A and 500B are a common single platform formed of a same wafer. However, in another embodiment, interposers 500A and 500B may be separated interposers coupled to one another via SoC 300.

In an embodiment, a portion of usable area 510 of interposer 500A bordering a left-most edge of offset region 515, as generally indicated by dotted line 710A, and/or a portion of usable area 510 of interposer 500B bordering a right-most edge of offset region 516, as generally indicated by dotted line 710B, may optionally be respective portions used to define an interconnect restricted area 599 in addition to being responsive to offset regions 515 and 516. However, for purposes of clarity and not limitation, it shall be assumed that interconnect restricted area 599 described below in additional detail is formed only responsive to offset regions 515 and 516, even though in other embodiments a portion of otherwise usable area 510 may be used.

It should be understood that SoC 300 conventionally may have dense micro bumps or other fine pitch interconnects, including conductive line interconnect components, that fall within either or both of offset regions 515 and 516. Again, interconnect restricted area 599 of interposers may include interconnects, but generally does not include fine pitch interconnects. As offset regions 515 and 516 are not suitable for fine pitch interconnects, for SoC 300 to bridge interposers 500A and 500B, whether they are severed from one another or not, fine pitch "pinout" layout of such SoC 300 may not be conventional. Rather, fine pitch "pinout" layout of SoC 300 may be tailored to bridging interposers 500A and 500B. Along those lines, fine pitch interconnects of SoC 300 disposed over offset regions 515 and 516 may be aligned to coarse pitch interconnects that fall within offset regions 515 and 516, namely fall within interconnect restricted area 599, of interposers 500A and 500B.

Memory pools 303A and 303B are interconnected to a surface of interposer 500B. For example, memory pools 303A and 303B may be interconnected to an upper surface of interposer 500B for inter-die coupling with SoC 300. Memory pools 303A and 303B may be coupled to SoC 300 for bidirectional communication.

Interposers 500A and 500B may have a same or a substantially same height. Width W1 of interposer 500A may be less than or equal to a maximum interposer width 502, and width W2 of interposer 500B likewise may be less than or equal to a maximum interposer width 502. However, width W1 may be substantially larger than width W2 in order to accommodate different die sizes. An interposer assembly of interposers 500A and 500B may have an overall interposer assembly width 602 of width W1+W2. For purposes of clarity by way of example not limitation, for an interposer height of approximately 33 mm (approximately 1.299 inches) for each of interposers 500A and 500B, an overall interposer assembly width 602 of approximately 40 millimeters (approximately 1.575 inches) may be used with SoC 300 having a width of approximately 24 millimeters (approximately 0.9449 inch). For such example, stacked die assembly 600A may fit within a single 50 mm (1.969 inches)×50 mm (1.969 inches) package. However, in other embodiments, other heights, widths, and/or package sizes may be used.

An edge of interposer 500A and an edge of interposer 500B are positioned at least substantially side-by-side to one another. In an embodiment where interposers 500A and 500B are severed from one another, such edges of interposers 500A and 500B may abut one another. Interposer 500A may have a reserved or offset region 515 generally proximal to interposer 500B. In this exemplary embodiment, offset region 515 has a boundary that is coterminous with a far right edge of interposer 500A. Interposer 500B may have a reserved or offset region 516 generally proximal to interposer 500A. In this exemplary embodiment, offset region 516 has a boundary that is coterminous with a far left edge of interposer 500B.

In an embodiment, one or both of offset regions 515 and 516 may be accounted for in dense fine pitch pinout layout of SoC 300, where SoC 300 is formed to provide an electrical interconnection within restricted area 599 associated with offset regions 515 and 516 of interposers 500A and 500B, respectively, though not with fine pitch-to-fine pitch die-to-die interconnection. In an embodiment, either or both of offset regions 515 and 516 may be formed such that they include no metal layer portion and no via layer portion used to provide an operative fine pitch-to-fine pitch electrical interconnection, and thus SoC 300 may not include any pinouts for corresponding fine pitch interconnects associated within such offset regions 515 and 516. Furthermore, for example, in an embodiment, either or both of offset regions 515 and 516 may be formed such that they include no electrical interconnects and associated conductive lines.

Electrical interconnects are used to carry signal for operation of a device. Electrical interconnects may be contrasted from non-electrical interconnects for nonelectrical structures, such as for example dummy structures, such as may be used for example for lithographic imaging or otherwise.

In an embodiment, fine pitch die-to-die interconnects, such as die-to-die interconnects described below for example, for interconnecting SoC 300 to memory pools 303A and 303B via interposer 500B may be exclusively located on interposer 500B outside of offset region 516. In an embodiment, all fine pitch conductive lines for interconnecting SoC 300 to memory pools 303A and 303B may be formed as part of interposer 500B outside of offset region 516.

It is possible to provide wide busses for ground planes or supply voltages, and as such fine pitch or precise interconnection is not necessarily required for such wide busses. Thus, for example, in an embodiment, one or more fine pitch interconnects of SoC 300 may be placed for such wide busses in an interconnect restricted area of an interposer, as a fine pitch alignment restriction does not necessarily apply to such wide bussing. However, for purposes of clarity and not limitation, it shall be assumed that interconnect restricted area 599 is free of any operative interconnects, even though in other embodiments interconnects not subject to fine pitch alignment restrictions may be present in such interconnect restricted area 599.

Figure 6B:
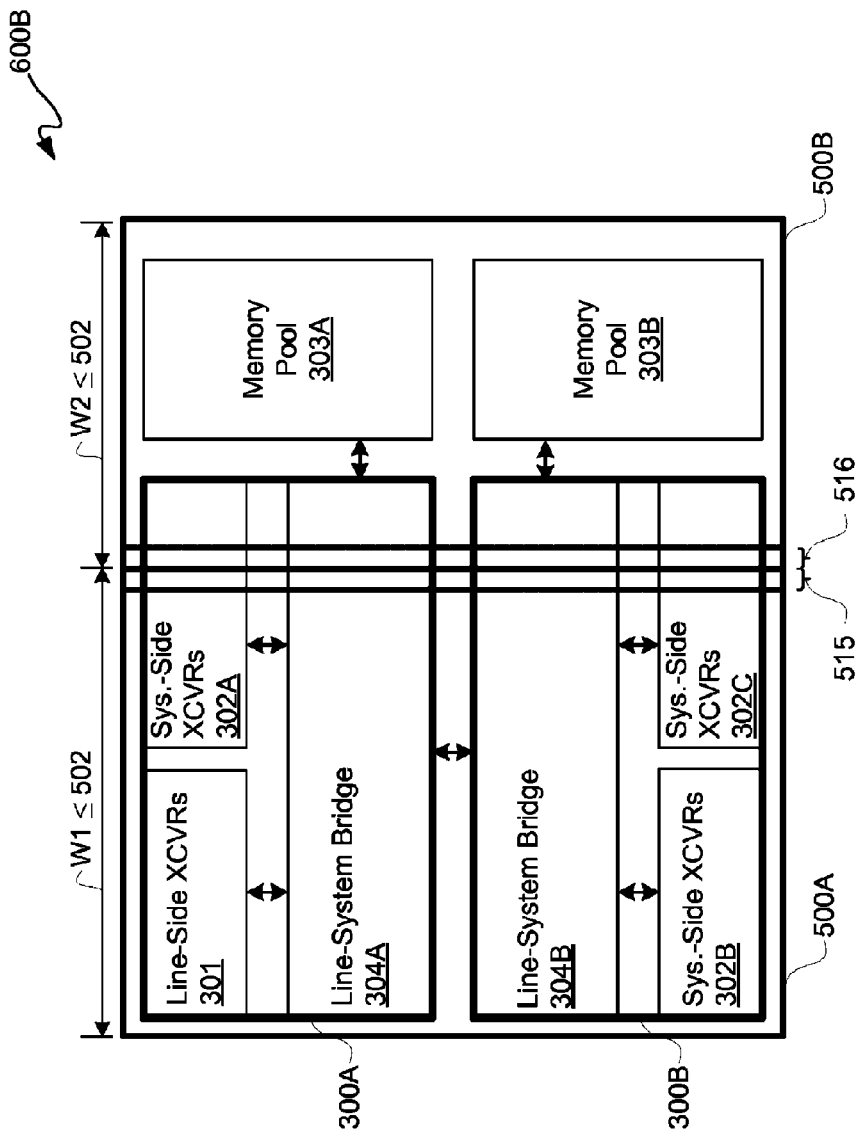
FIG. 6B is a block diagram depicting another exemplary embodiment of a stacked die assembly.

FIG. 6B is a block diagram depicting another exemplary embodiment of a stacked die assembly 600B. Stacked die assembly 600B is generally the same as stacked die assembly 600A of FIG. 6A, except for the following differences. Rather than a single SoC 300, stacked die assembly 600B includes two SoCs, namely SoC 300A and SoC 300B. In this exemplary embodiment, SoC 300A includes line-side transceivers 301, system-side transceivers 302A and line-system bridge 304A, and SoC 300B includes system-side transceivers 302B and 302C and line-system bridge 304B. SoCs 300A and 300B may be interconnected to one another via interconnects associated with interposer 500A.

Figure 6C:
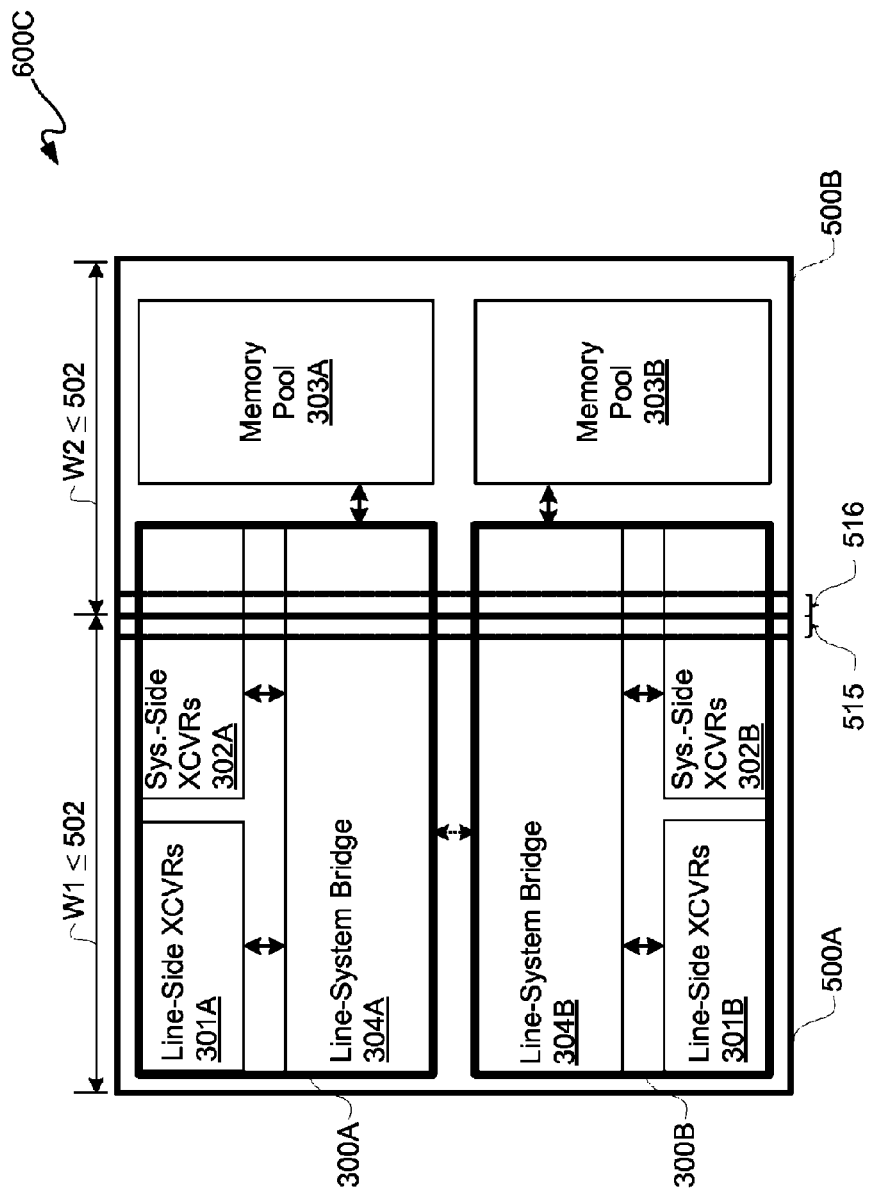
FIG. 6C is a block diagram depicting yet another exemplary embodiment of a stacked die assembly.

In the exemplary embodiments of stacked die assemblies 600A and 600B, there are more system-side transceivers than line-side transceivers. However, other configurations in other embodiments may be used. For example, FIG. 6C is a block diagram depicting yet another exemplary embodiment of a stacked die assembly 600C. Stacked die assembly 600C is generally the same as stacked die assembly 600B of FIG. 6B, except for the following differences. In stacked die assembly 600C, SoC 300A includes line-side transceivers 301A and system-side transceivers 302A, as well as line-system bridge 304A, and SoC 300B includes line-side transceivers 301B and system-side transceivers 302B, as well as line-system bridge 304B. Each of SoCs 300A and 300B may bridge offset regions 515 and 516 for coupling interposers 500A and 500B to one another or for interposers 500A and 500B not severed from one another. In an embodiment, approximately equal amounts of semiconductor area may be provided for forming line-side and system-side transceivers, and two SoCs may be used to physically bridge interposers 500A and 500B. For SoCs implemented with FPGAs, transceiver resources may be configured either for line-side or system-side.

Because interposers, such as interposers 500A and 500B, may be fabricated for particular dies, a mask set used to form interposer 500A may be substantially different from a mask set used to form interposer 500B. For example, an SoC die may be substantially different than a memory die, including without limitation substantially different sizes and pinouts.

By providing an interposer assembly as described herein, it should be understood that more transceivers, as well as more resources generally, for line-system bridging may be implemented in a single IC package along with buffer memory. Furthermore, the amount of memory may be substantially increased owing to having a larger interposer assembly footprint. Because such resources may be collectively mounted to an interposer assembly for an IC package, die-to-die interconnects may be formed with dense micro bumps for example which are significantly smaller than conventional micro bumps and substantially smaller than micro-balls. Micro-balls, which are sometimes referred to C4 solder balls, are significantly larger than conventional micro bumps and are conventionally used for an IC-to-IC interconnect via a PCB.

In other words, interconnect density is enhanced by providing an interposer assembly with a larger footprint within a package, because more area is provided for fine pitch die-to-die interconnection, which may be used instead of conventional die-to-die interconnects and/or chip-to-chip interconnects. By increasing interconnect density via an interposer assembly, bandwidth may correspondingly be increased by virtue of such interconnect density. Bandwidth increase may be further aided by an additional amount of resources available within a packaged stacked die assembly having a large interposer assembly for supporting such additional resources.

FIG. 7A is a block diagram depicting an exemplary embodiment of a cross-sectional view of any of stacked die assemblies 600A, 600B, and 600C (collectively and singly "stacked die assembly 600") of FIG. 6A, 6B, or 6C, respectively. SoC 300 and memory pool 303 are interconnected to an interposer assembly formed of interposers 500A and 500B via interconnects 713. Interconnects 713 in this exemplary embodiment are dense die-to-die flip-chip micro bumps; however, other types of die-to-die fine pitch interconnects may be used.

SoC 300 is connected to upper surface 703 of interposer 500A via a portion of die-to-die interconnects 713, which may be fine pitch interconnects or may be conventional flip-chip micro bumps, and is connected to upper surface 704 of interposer 500B via another portion of die-to-die interconnects 713. Memory pool 303 is connected to upper surface 704 of interposer 500B via yet another portion of die-to-die interconnects 713. Some of die-to-die interconnects 713 may be coupled to other larger interconnects, which are referred to herein as "connectors" 711 so as not to be confused with die-to-die interconnects ("interconnects") 713. For example, connectors 711 may be coupled to interconnects 713 using "through-substrate vias", such as through-silicon vias ("TSVs") 712 for example. In this embodiment, connectors 711 are micro-balls; however, other types of chip-to-chip large-scale interconnects may be used. Again, connectors 711 are substantially larger than interconnects 713. Accordingly, by providing an interposer assembly formed of interposers 500A and 500B, which may be joined to or severed from one another, a larger interposer area for interconnecting dies is provided so as to avoid having to use chip-to-chip interconnects. For purposes of clarity and not limitation, it shall be assumed that such interposers 500A and 500B are severed from one another, namely separate dies. In other words, die-to-die interconnects are used where heretofore chip-to-chip interconnects may have been used. As interconnect density is greater with interconnects 713 than connectors 711, bandwidth may be enhanced for an IC as previously described. Furthermore, in this exemplary embodiment, interposers 500A and 500B are silicon interposers, and thus for this exemplary embodiment, through-substrate vias are TSVs 712; however, in other embodiments other types of substrates or die platforms may be used.

A far right edge 701 of interposer 500A in this exemplary embodiment abuts a far left edge 702 of interposer 500B. Edges 701 and 702 respectively provide boundaries of offset regions 515 and 516, as previously described herein. Collectively, in an embodiment, offset regions 515 and 516 of interposers 500A and 500B, respectively, may be free of active fine pitch interconnects and associated conductive lines, namely an interconnect restricted area or region 710 which may correspond to all or portions of offset regions 515 and 516.

A portion of interconnects 713 on upper surface 704 of interposer 500B are for interconnecting SoC 300 and memory pool 303. Conductive lines, such as conductive line 715 (hereinafter singly and collectively "conductive lines 715"), which may for example be between layers of interposer 500B, are used to couple a portion of interconnects 713 located between SoC 300 and upper surface 704 with another portion of interconnects 713 located between memory pool 303 and upper surface 704. Thus, in an embodiment, all conductive lines 715 for interconnecting SoC 300 and memory pool 303 may be provided as part of interposer 500B. In other words, in such an embodiment, all conductive lines 715 for die-to-die interconnection may be self-contained within interposer 500B. Interconnects 713 and conductive lines 715 are examples of components that may be used to interconnect SoC 300 to memory pool 303. Interconnects 713 and conductive lines 715 may singly and collectively provide fine pitch interconnects.

FIG. 7B is a block diagram depicting a cross-sectional view of yet another exemplary embodiment of a stacked die assembly 700. Stacked die assembly 700 is similar to stacked die assembly 600, except memory pool 303 is replaced with a vertical stack of memory dies interconnected to one another, namely stacked die memory 720. Stacked die memory 720 may include memory pool dies ("memory pools") 303-1 through 303-N, for N a positive integer greater than one. Even though not shown for purposes of clarity and not limitation, it should be understood that memory pool dies 303-1 through 303-N may be interconnected to one another, such as through use of TSVs for example, to provide stacked die memory 720. Memory pool die 303-1 may be interconnected to interposer 500B as previously described for example with reference to memory pool 303.

Figure 7C:
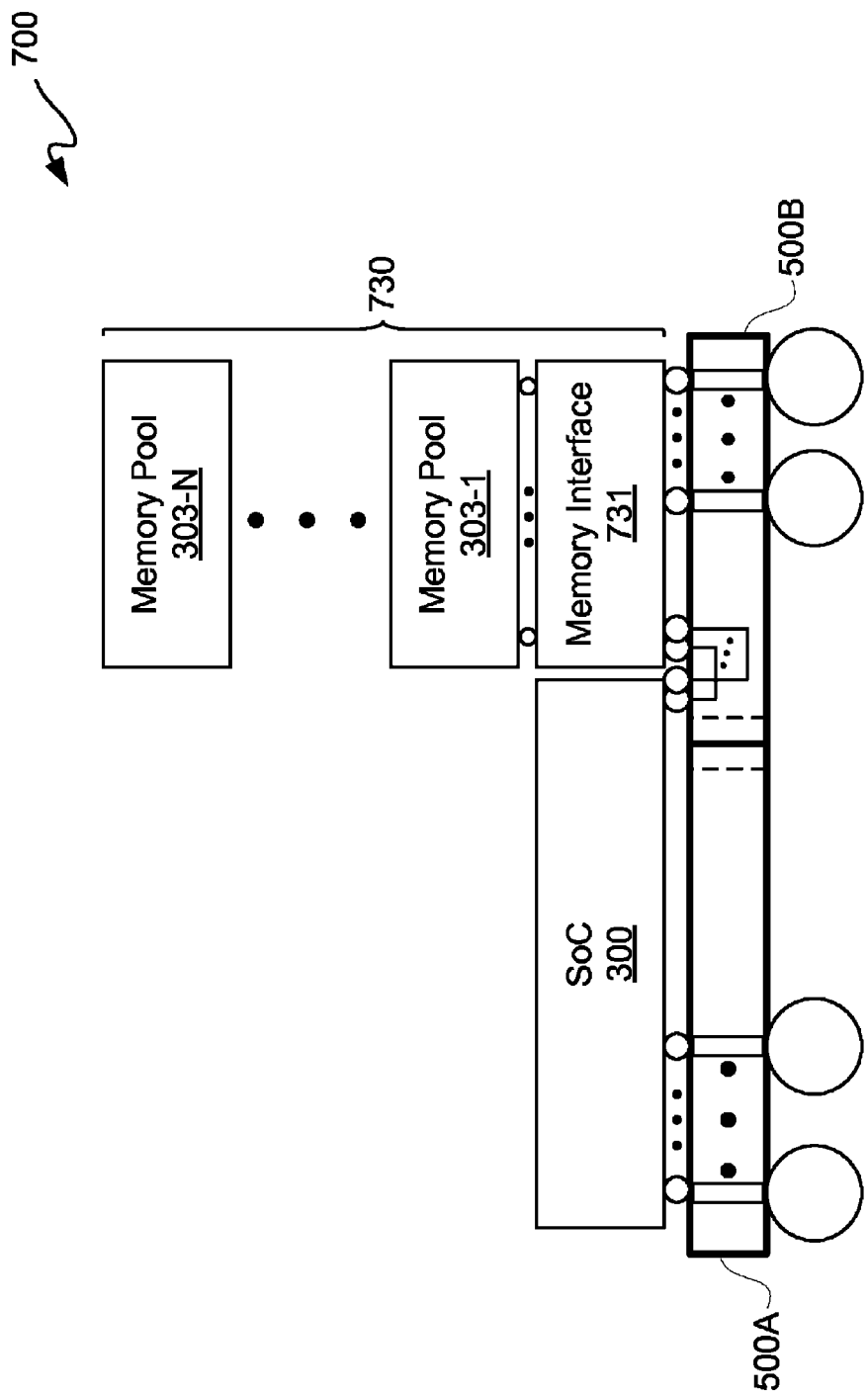
FIG. 7C is a block diagram depicting a cross-sectional view of yet another exemplary embodiment of a stacked die assembly.

FIG. 7C is a block diagram depicting a cross-sectional view of still yet another exemplary embodiment of stacked die assembly 700. In this exemplary embodiment, memory pool dies 303-1 through 303-N are stacked on top of a memory interface 731 for forming a stacked die memory 730. Stacked die memory 730 replaces stacked die memory 720. Memory interface 731 is interconnected to interposer 500B. Memory interface 731 may include interface logic for memory pool dies 303-1 through 303-N. Memory interface 731 is interconnected to a memory pool die 303-1 and may be interconnected to each of memory pool dies 303-1 through 303-N through one or more intervening memory pool dies thereof depending on configuration of stacked die memory 730.

Figure 8:
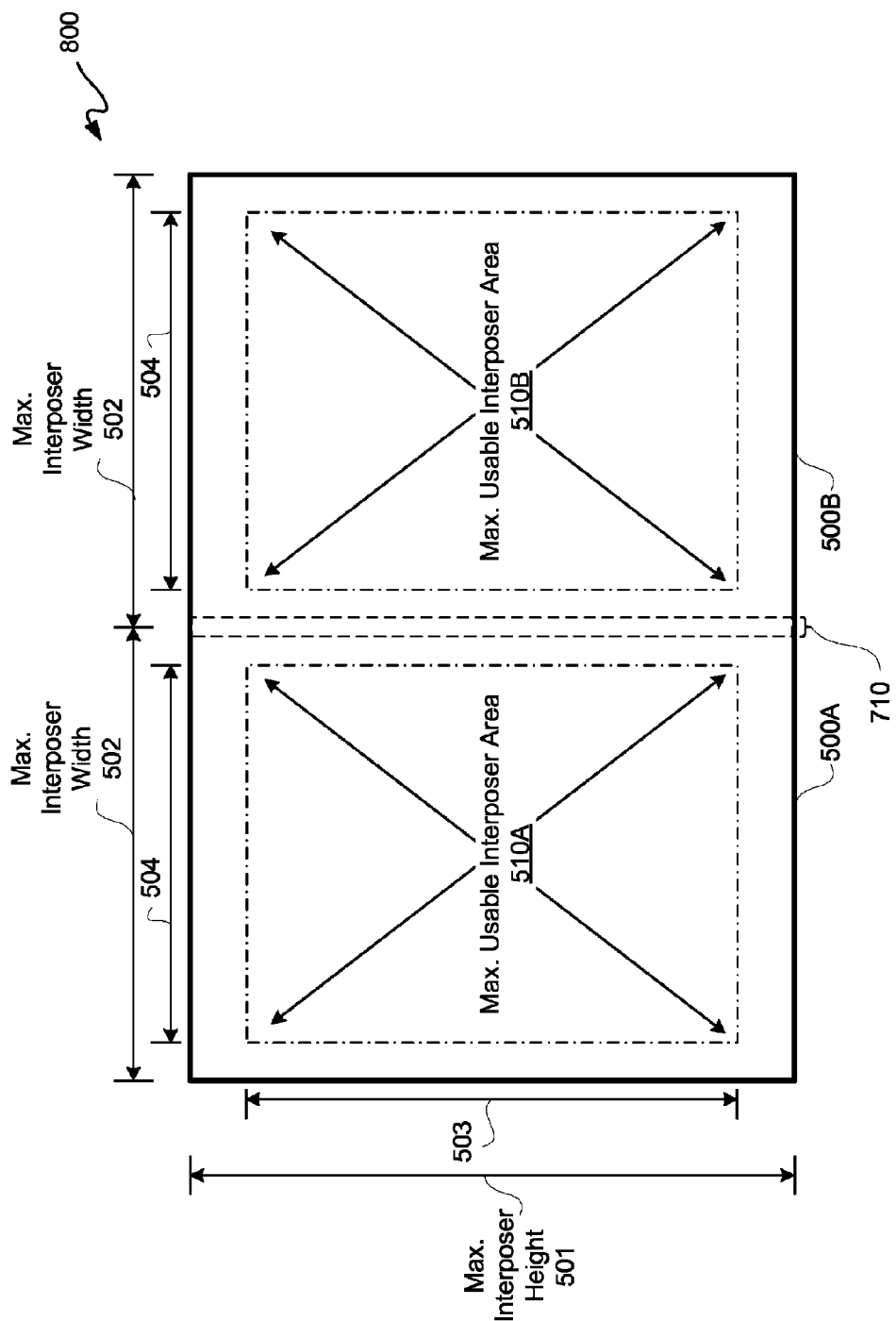
FIG. 8 is a block diagram depicting a top view of an interposer assembly.

FIG. 8 is a block diagram depicting an exemplary embodiment of a top view of an interposer assembly 800. Interposer assembly 800 includes interposers 500A and 500B. Each of interposers 500A and 500B has a height which may be equal to or less than a maximum interposer height 501. For purposes of clarity by way of example and not limitation, both of interposers 500A and 500B in this exemplary embodiment have a same maximum interposer height 501 and likewise have a same maximum usable height 503. However, in other embodiments, interposers 500A and 500B may have unequal heights at least one of which is not at a maximum height.

Each of interposers 500A and 500B has a width which may be equal to or less than a maximum interposer width 502. For purposes of clarity by way of example and not limitation, both of interposers 500A and 500B in this exemplary embodiment have a same maximum interposer width 502 and likewise have a same maximum usable width 504. However, in other embodiments, interposers 500A and 500B may have unequal widths at least one of which is not a maximum width.

In this exemplary embodiment, electrical interconnect restricted area 710 is not defined responsive to abutting diced edges of interposers 500A and 500B, as interposers 500A and 500B in this embodiment are formed on a same wafer or other substrate as a whole, namely are formed integral to one another as a single platform. In other words, interposers 500A and 500B are formed as a single platform in contrast to two separate platforms. Thus, interposers 500A and 500B in this exemplary embodiment are from a same semiconductor substrate to provide a single platform. Offset regions 515 and 516 of interposers 500A and 500B may be used to define an electrical interconnect restricted area 710. However, in an embodiment where interposers 500A and 500B are formed as a single platform, electrical interconnect restricted area 710 need not include a scribe line seam and need not include margining for dicing for packaging. Thus, in an extended or single platform interposer embodiment of interposers 500A and 500B, maximum usable area may be increased over an embodiment where interposers 500A and 500B are diced to provide separate dies thereof, and accordingly, footprint of interconnect restricted area 710 may be reduced subject to interposer reticle field lithographic imaging limitations.

Because separate reticle sets are used in the formation of interposers 500A and 500B, aligning such reticle sets to one another for forming interconnects across a seam thereof may be problematic. Interconnect restricted area 710 may be enlarged to mitigate against alignment issues. Even though the example of a silicon wafer is used for the description herein of forming interposers 500A and 500B, other types of substrates may be used, including without limitation glass or another form of substrate base material.

Figure 9A:
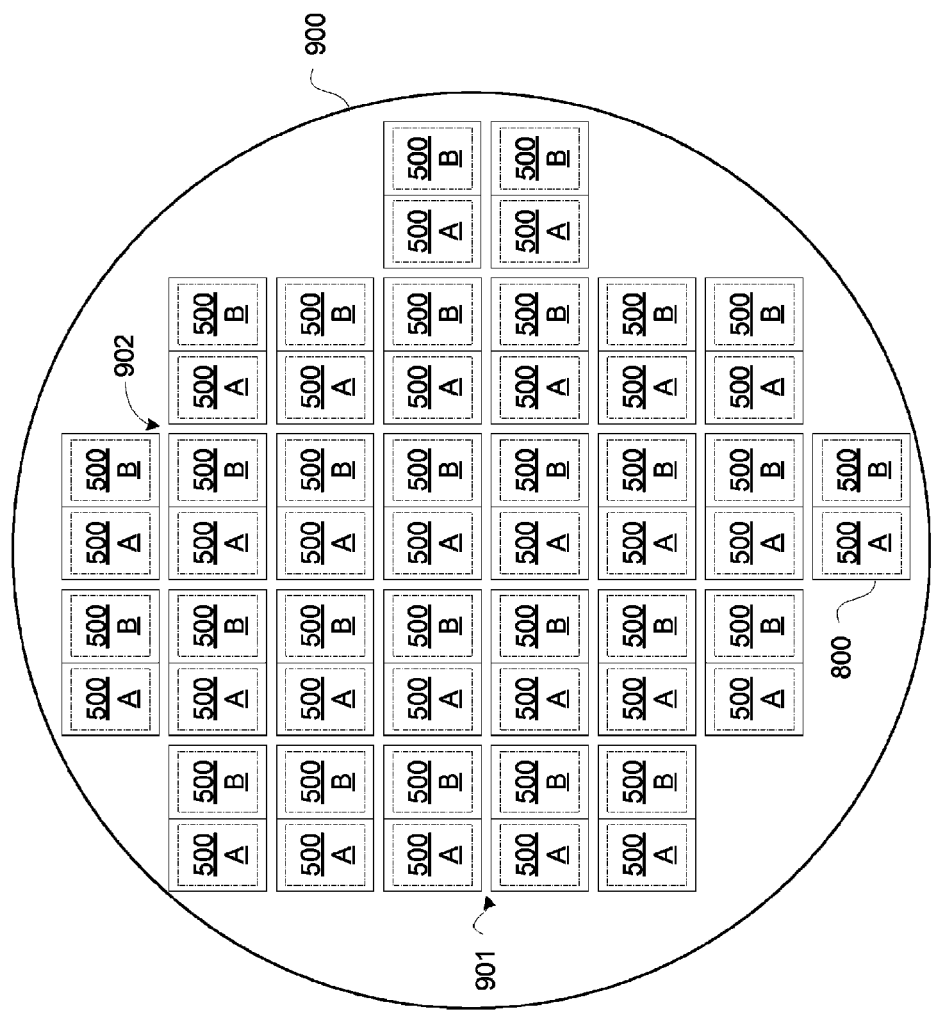
FIG. 9A is a block diagram depicting an exemplary embodiment of a wafer.

FIG. 9A is a block diagram depicting an exemplary embodiment of a wafer 900. Wafer 900 may be used for forming interposer assemblies 800 of interposers 500A and 500B. Two separate reticle sets may be used to print interposer patterns, including without limitation wires and vias, for forming interposers 500A and 500B. Wafer 900 may be laser ablated and/or sawn along horizontal rows 901 and vertical columns 902. Horizontal rows 901 and vertical columns 902 may be scribe lines. It should be appreciated that after dicing wafer 900, interposer assemblies 800, having interposers 500A and 500B formed integral to one another of the same wafer substrate material, are provided as dies of a single platform.

Figure 9B:
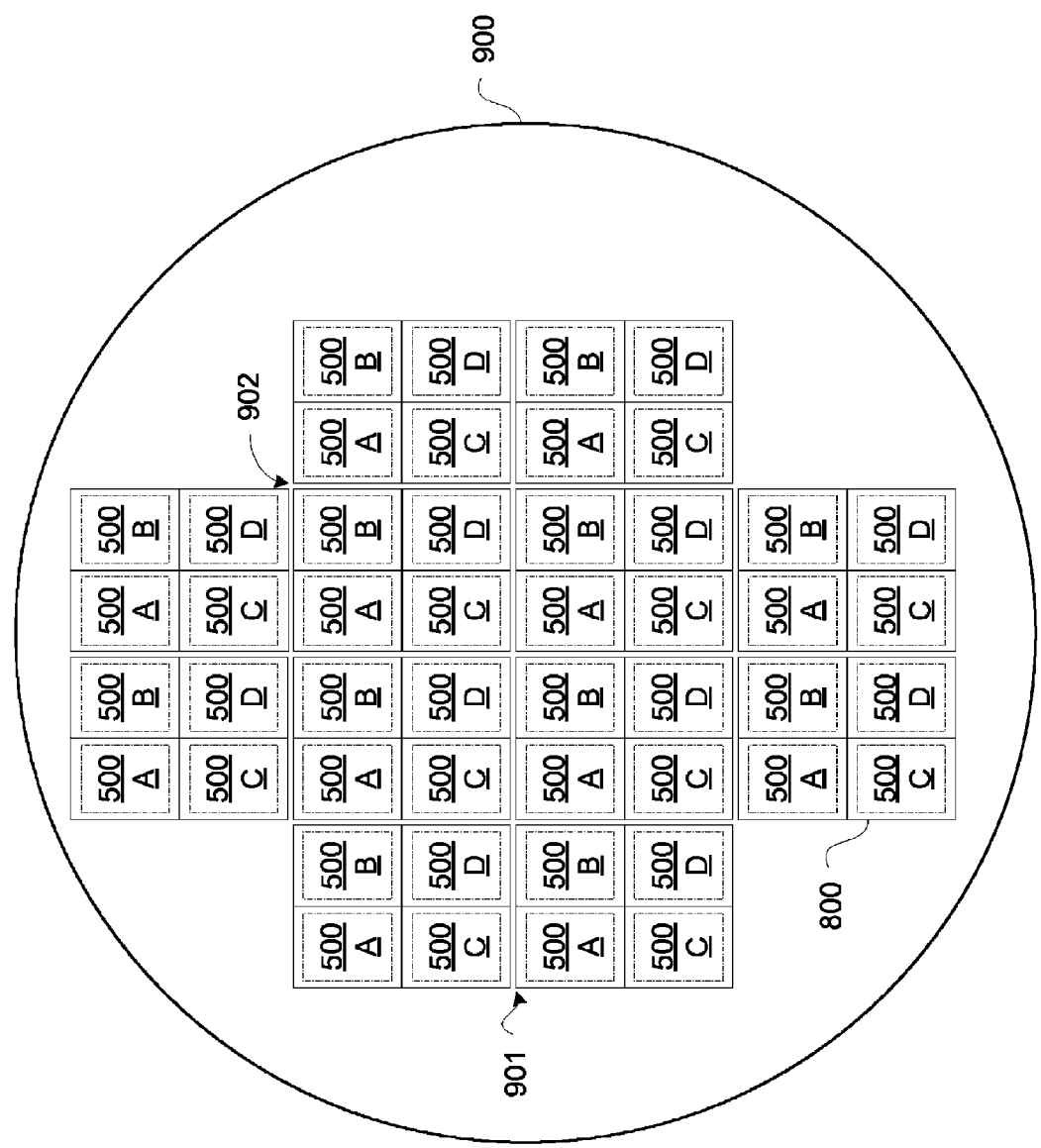
FIG. 9B is a block diagram depicting another exemplary embodiment of wafer.

Even though two interposers are illustratively depicted for forming interposer assemblies 800, more than two interposers may be integrally formed to one another from a same wafer substrate material to be provided as dies. For example, FIG. 9B is a block diagram depicting an exemplary embodiment of wafer 900 with interposer assemblies 800 formed of four interposers each. In this exemplary embodiment, interposer assemblies 800 each include interposers 500A, 500B, 500C, and 500D, where such collection of interposers are formed integral to one another as single or common platform.

Figure 10A:
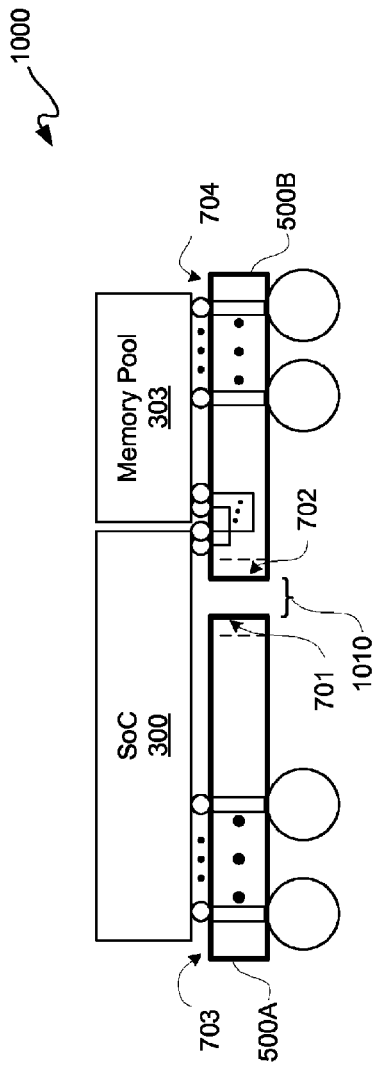
FIG. 10A is a block diagram depicting a cross-sectional view of still yet another exemplary embodiment of a stacked die assembly.

FIG. 10A is a block diagram depicting a cross-sectional view of an exemplary embodiment of a stacked die assembly 1000. Stacked die assembly 1000 is similar to stacked die assembly 600, except that rather than abutting edges 701 and 702, a gap 1010 between such edges is provided. Edges 701 and 702 may or may not be position at lease substantially parallel to one another for such side-by-side orientation. In this embodiment, gap 1010 effectively extends a restricted interconnect area 1049, and accordingly, as what might otherwise be pinouts under SoC 300 extending above gap 1010 may be omitted. Rather than reduce pinouts of SoC 300, a die other than SoC 300 may be used to bridge interposers 500A and 500B.

However, it should be understood that if interposers 500A and 500B have a gap 1010 between them, then a seam associated with reticle fields used to form such interposers may not exist if such interposers are formed from different wafers. However, such offset regions 515 and 516 persist, and thus for purposes of clarity and not limitation it shall be assumed that an interconnect restricted region or area 1049 persists and includes gap 1010.

Figure 10B:
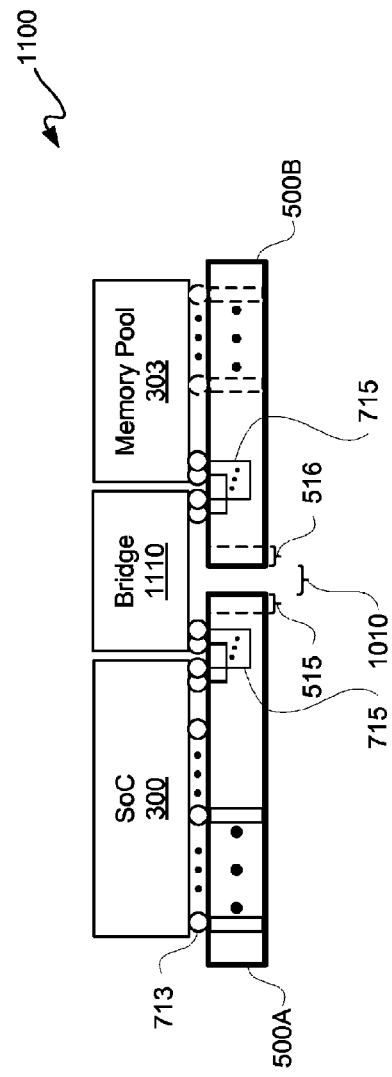
FIG. 10B is a block diagram depicting a cross-sectional view of yet still further another exemplary embodiment of stacked die assembly.

FIG. 10B is a block diagram depicting a cross-sectional view of an exemplary embodiment of a stacked die assembly 1100. Stacked die assembly 1100 is similar to stacked die assembly 1000, except for the following differences. In stacked die assembly 1100, SoC 300 does not bridge interposers 500A and 500B, and thus SoC 300 is interconnected only to interposer 500A in this exemplary embodiment. However, a bridge die 1110 is added to interconnect an upper surface of interposer 500A and to an upper surface of interposer 500B. Bridge die 1110 spans offset regions 515 and 516, as well as gap 1010 between interposers 500A and 500B, for physically bridging such interposers. A portion of each of interposers 500A and 500B optionally may be used to provide interconnect restricted area or region 710, as previously described. For example, in an embodiment with separate interposers 500A and 500B, image quality generally along edges of image fields associated with one or more reticles used in manufacturing interposer 500A and 500B may be sufficiently degraded so as to make reliably forming fine pitch interconnects in areas or regions associated with such edges problematic. In this embodiment, fine pitch interconnects 713 and fine pitch conductive lines 715 respectively associated with interposer 500A and 500B are all outside of offset regions 515 and 516. In such an embodiment, bridge die 1110 may be a passive device. For example, bridge die 110 may itself be a silicon interposer. However, whether a passive or an active die, bridge die 1110 may be manufactured to have a pinout that accounts for offset regions 515 and 516, as well as gap 1010.

For purposes of clarity by way of example and not limitation, bridge die 1110 may be interconnected to SoC 300 via interposer 500A using associated fine pitch micro bumps. Moreover, bridge die 1110 may be interconnected to a memory pool die 303 via interposer 500B using associated fine pitch micro bumps.

In an embodiment, bridge die 1110 may be an active die. Thus, for example, bridge die 1110 may provide a bidirectional communication bridge between SoC 300 and memory pool 303. By way of example and not limitation, bridge die 1110 may include buffers and/or pipelined flip-flops for die-to-die communication. In an embodiment, bridge die 1110 may provide an interconnection network between SoC 300 and memory pool 303, such as for switching for example. In an embodiment, bridge die 1110 may optionally include an array of bidirectional repeaters 1111 or a set of crossbar switches 1111, where each such bidirectional repeater or crossbar switch 1111 may be statically configured to be either transferring signals from a first IC to a second IC, such as for example from SoC 300 to memory pool 303, and/or the other way round. For an embodiment with bidirectional repeaters 1111, configuration bits for such array of bidirectional repeaters 1111 may eventually be stored inside bridge die 1110, although such configuration bits may be initialized by one of such other ICs, such as SoC 300 or memory pool 303 for example. For an embodiment with a set of at least two crossbar switches 1111, such crossbar switches 1111 may be statically configured. A P-by-Q-by-W ("P×Q×W") crossbar switch 1111 has P input ports, Q output ports, and W bits per port, and may be implemented as Q instances of a P-to-1 mux with a W-bit-wide datapath. Select control lines of these P-to-1 muxes can be static so traffic between the first and the second ICs, such as between SoC 300 and memory pool 303 for example, do not have to go straight. Two crossbar switches 1111 may be used to allow traffic to be able to go from a first IC to a second IC and/or the other way round.

In this exemplary embodiment, offset region 515 provides a first portion of an electrical interconnect restricted area of interposer 500A outside of which fine pitch interconnects, as well as fine pitch conductive lines associated therewith, for interconnecting bridge die 1110 to interposer 500A for interconnection to SoC 300 may be formed. Likewise, offset region 516 provides a second portion of an electrical interconnect restricted area of interposer 500B outside of which fine pitch interconnects, as well as fine pitch conductive lines associated therewith, for interconnecting bridge die 1110 to interposer 500B for interconnection to memory pool 303 may be formed. Lastly, fine pitch interconnects of bridge die 1110 for bidirectional repeaters 1111 or crossbar switches 1111 may be outside of and/or extend above interconnect restricted area 1049 though are generally not available for gap 1010.

Figure 11:
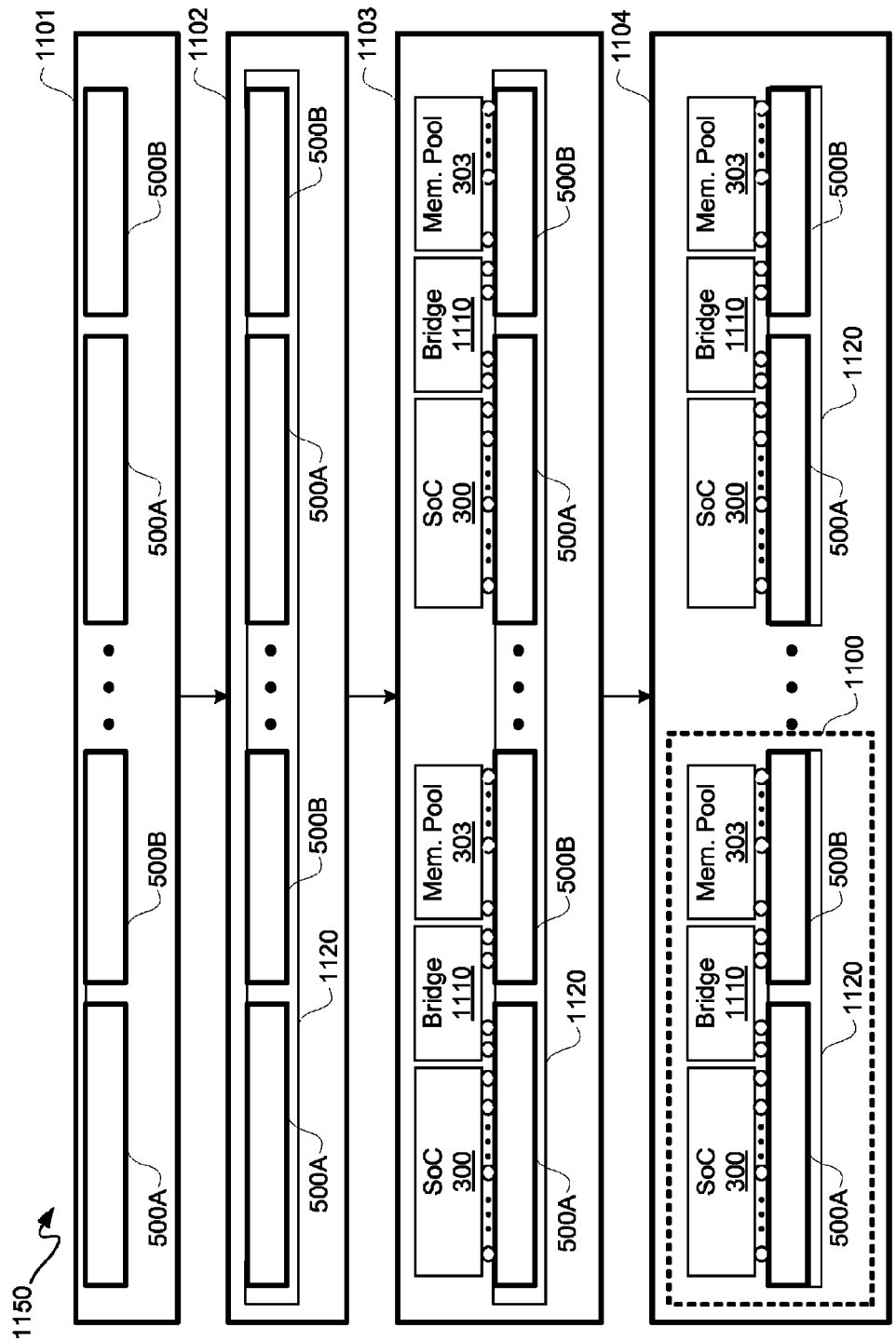
FIG. 11 is a flow diagram depicting an exemplary embodiment of a process for forming one or more stacked die assemblies.

FIG. 11 is a flow diagram depicting an exemplary embodiment of a process 1150 for forming one or more of stacked die assemblies 1100. Stacked die assemblies 1100 are similar to stacked die assembly 1100 of FIG. 10B, except for the following differences. Furthermore, even though an example of stacked die assembly 1100 is used, it should be understood that stacked die assembly 1000 may be used in such process 1150.

At 1101, interposers 500A and 500B are formed as separate die for forming pairs thereof. Accordingly, interposers 500A and 500B may be diced from same or separate wafers. By way of example not limitation, one wafer may be used exclusively for forming interposers 500A, and another wafer may be used exclusively for forming interposers 500B.

At 1102, interposers 500A and 500B formed at 1101 are placed into or otherwise put in contact with a molding or packaging material 1120. Effectively at 1102, a wafer or other substrate may be re-constructed with interposers 500A and 500B in respective pairs using a mold. It should be appreciated that a portion of such packaging material 1120 extends between pairs of interposers 500A and 500B, namely extends into gap 1010.

At 1103, SoC 300, bridge die 1110, and memory pool 303 may be interconnected to interposers 500A and 500B, as previously described herein. At 1104, stacked die assemblies 1100 may be diced from such molded substrate. Thus, unitary stacked die assemblies 1100 may be provided as set in packaging material 1120, where each such unitary stacked die assembly 1100 has a portion of packaging material 1120 extending between an edge of interposer 500A and an edge of interposer 500B.

Having two or more separate interposers with one or more bridge die may reduce stress. Furthermore, separate interposers may allow for combinations thereof to be customized by changing one or more of such interposer to accommodate different types of ICs. Total yield may be improved with a combination of separate interposers, as known good interposers may be combined to form interposer assemblies. Separate interposers may reduce warping, which may increase assembly yield during top die assembly on interposers. Separate interposers may reduce underfilling of fine pitch interconnects.

It should be understood from the above description of several embodiments of stacked die assemblies, multiple dies may be interconnected to one another over a larger interposer area than previously available. Even though the embodiment of adding memory, such as DRAM, to an SSIT-based FPGA die stack was used, it should be understood that the following description applies to any stacked die assembly in which die-to-die interconnects are enhanced by use of multiple interposers within a same package. A stacked die assembly as described herein may not be as constrained by current lithography, margining for packaging and assembly, and/or availability of die-to-die interconnects. Furthermore, even though the above description is generally in terms of passive interposers, it should be understood that either or both of interposers 500A and 500B for example as described herein may be active interposers, namely interposers with active components.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An assembly, comprising:
   a first interposer, the first interposer having a first offset region;
   a second interposer, the second interposer having a second offset region;
   a first integrated circuit die interconnected to the first interposer and the second interposer;
   a second integrated circuit die interconnected to the second interposer;
   a plurality of components that interconnect the first integrated circuit die to the first interposer and the second interposer; and
   wherein signals are routed between the first interposer and the second interposer via the first integrated circuit die and the plurality of components, and signals are routed between the first integrated circuit die and the second integrated circuit die via a plurality of conductive lines of the second interposer which are outside of the second offset region.

2. The assembly according to claim 1, wherein the first interposer and the second interposer are separate dies coupled to one another via the first integrated circuit die and the plurality of components.

3. The assembly according to claim 1, wherein the first interposer and the second interposer are a single platform from a same substrate.

4. The assembly according to claim 1, wherein:
   the plurality of components includes a plurality of die-to-die interconnects;
   a first portion of the plurality of die-to-die interconnects interconnect the first integrated circuit die to the first interposer;
   a second portion of the plurality of die-to-die interconnects interconnect the first integrated circuit die to the second interposer;
   wherein the first portion and the second portion of the plurality of die-to-die interconnects are disposed on opposing sides of the second offset region;

a third portion of the plurality of die-to-die interconnects interconnect the second integrated circuit die to the second interposer;

a portion of the plurality of conductive lines of the second interposer are coupled to the second portion of the plurality of die-to-die interconnects and the third portion of the plurality of die-to-die interconnects in order to interconnect the first integrated circuit die to the second integrated circuit die, and wherein the second portion of the plurality of die-to-die interconnects are located outside the second offset region.

5. The assembly according to claim 1, wherein:
the first offset region has a first boundary that is coterminous with a first edge of the interposer; and
the second offset region has a second boundary that is coterminous with a second edge of the second interposer.

6. The assembly according to claim 1, wherein the first offset region and the second offset region include no metal layer and no via layer used for providing a fine pitch interconnect.

7. The assembly according to claim 1, wherein:
the first interposer is formed using a first mask set; and
the second interposer is formed using a second mask set;
the first mask set is substantially different from the second mask set responsive at least in part to the second integrated circuit die being for a different type of integrated circuit than the first integrated circuit die.

8. The assembly according to claim 7, wherein:
a first height of the first interposer is substantially the same as a second height of the second interposer; and
a first width of the first interposer and a second width of the second interposer are both less than or equal to a same lithographic maximum width.

9. The assembly according to claim 1, wherein:
the second integrated circuit die includes a vertical stack of memory dies; and
the second integrated circuit die includes interface logic for the vertical stack of memory dies.

10. The assembly according to claim 1, further comprising chip-to-chip connectors coupled to the first interposer and the second interposer.

11. The assembly according to claim 1, further comprising a packaging material in which the first interposer and the second interposer are located.

12. The assembly according to claim 1, wherein the plurality of components that interconnect the first integrated circuit die to the first interposer and the second interposer include fine pitch interconnects.

13. The assembly according to claim 1, further comprising:
a third integrated circuit die interconnected to both the first interposer and the second interposer,
wherein the third integrated circuit die provides a communication bridge between the first integrated circuit die and the second integrated circuit die; and
wherein the third integrated circuit die includes an array of bidirectional repeaters or a set of crossbar switches each of which is capable of being statically configured for communication between the first integrated circuit die and the second integrated circuit die.

14. The assembly according to claim 13, further comprising:
a packaging material in which the first interposer and the second interposer are located;
wherein signals are routed via the third integrated circuit die from the first integrated circuit die to the second integrated circuit die avoiding an interconnect restricted area of the first interposer and the second interposer.

15. The assembly according to claim 13, wherein:
the third integrated circuit die is interconnected to the first interposer via first die-to-die interconnects and the second interposer via second die-to-die interconnects;
the first die-to-die interconnects and the second die-to-die interconnects are outside of the first and second offset regions of the first interposer and the second interposer; and
the first die-to-die interconnects and the second die-to-die interconnects are fine pitch interconnects.

16. A method for forming an assembly, comprising:
interconnecting a first integrated circuit die to a first interposer and a second interposer using a plurality of components, wherein the first interposer has a first offset region and the second interposer has a second offset region;
interconnecting a second integrated circuit die to the second interposer using the plurality of components;
routing signals between the first interposer and the second interposer via the first integrated circuit die and the plurality of components; and
routing signals between the first integrated circuit die and the second integrated circuit die via conductive lines of the second interposer which are outside of the second offset region.

17. The method according to claim 16, further comprising forming the first interposer and the second interposer on a same substrate as a single platform.

18. The method according to claim 16, further comprising molding the first interposer and the second interposer in a packaging material.

19. The method according to claim 16, wherein the first second integrated circuit die provides a communication bridge between the first integrated circuit die and a third integrated circuit die.

20. The method according to claim 16, wherein:
the interconnecting of the first integrated circuit die to the first interposer and the second interposer is via first fine pitch die-to-die interconnects of the plurality of components; and
the interconnecting of the second integrated circuit die to the second interposer is via second fine pitch die-to-die interconnects of the plurality of components.

* * * * *